United States Patent
Zhou et al.

(10) Patent No.: US 12,094,411 B2
(45) Date of Patent: Sep. 17, 2024

(54) DISPLAY PANEL HAVING SCAN LINES AND SCATTER LINES CONNECTED TO SWITCHES, METHOD OF DRIVING A DISPLAY UNIT, AND DISPLAY DEVICE HAVING A DISPLAY UNIT DRIVEN THEREBY

(71) Applicants: Chongqing HKC Optoelectronics Technology Co., Ltd., Chongqing (CN); HKC CORPORATION LIMITED, Shenzhen (CN)

(72) Inventors: Mancheng Zhou, Chongqing (CN); Rongrong Li, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/091,858

(22) Filed: Dec. 30, 2022

(65) Prior Publication Data

US 2023/0215366 A1    Jul. 6, 2023

(30) Foreign Application Priority Data

Dec. 30, 2021    (CN) .......................... 202111652861.4

(51) Int. Cl.
*G09G 3/3233*    (2016.01)
*H10K 59/35*    (2023.01)

(52) U.S. Cl.
CPC ... *G09G 3/3233* (2013.01); *G09G 2300/0819* (2013.01); *G09G 2300/0842* (2013.01);
(Continued)

(58) Field of Classification Search
CPC ..................................................... G09G 3/3233
See application file for complete search history.

(56) References Cited

U.S. PATENT DOCUMENTS

| 11,138,925 B1 * | 10/2021 | Wang ........................ G09G 3/32 |
| 2008/0036704 A1 * | 2/2008 | Kim ..................... G09G 3/3233 |
| | | 345/76 |

(Continued)

FOREIGN PATENT DOCUMENTS

| CN | 101123071 A | 2/2008 |
| CN | 101540148 A | 9/2009 |

(Continued)

OTHER PUBLICATIONS

U.S. Appl. No. 18/091,937, filed Dec. 30, 2022.
U.S. Appl. No. 18/092,180, filed Dec. 30, 2022.

*Primary Examiner* — Chun-Nan Lin
(74) *Attorney, Agent, or Firm* — Franklin & Associates International Inc; Matthew Lambrinos (57) ABSTRACT

Disclosed is a driving method for display unit, a display panel and a display device, a reset circuit is formed by a reset signal, a charging circuit is formed by a charging signal, and a light emitting circuit is formed by a light emitting signal, that is, the circuit in the display device is multiplexed by each control signal, so that it does not need to design a circuit for each function to realize the driving of the display unit, solving the complex problem of driving the display unit in the relevant technology.

12 Claims, 7 Drawing Sheets

(52) U.S. Cl.
CPC . *G09G 2310/0202* (2013.01); *G09G 2310/08* (2013.01); *H10K 59/351* (2023.02)

(56) References Cited

U.S. PATENT DOCUMENTS

| | | | |
|---|---|---|---|
| 2012/0001896 A1 | 1/2012 | Han | |
| 2017/0256198 A1* | 9/2017 | Hwang | H10K 59/123 |
| 2020/0184892 A1 | 6/2020 | Yang et al. | |
| 2022/0199024 A1 | 6/2022 | Zhang et al. | |

FOREIGN PATENT DOCUMENTS

| | | |
|---|---|---|
| CN | 103137067 A | 6/2013 |
| CN | 105243996 A | 1/2016 |
| CN | 105489167 A | 4/2016 |
| CN | 106328058 A | 1/2017 |
| CN | 107170407 A | 9/2017 |
| CN | 108335671 A | 7/2018 |
| CN | 109147665 A | 1/2019 |
| CN | 109523956 A | 3/2019 |
| CN | 110136650 A | 8/2019 |
| CN | 110197842 A | 9/2019 |
| CN | 110599959 A | 12/2019 |
| CN | 110660360 A | 1/2020 |
| CN | 111415620 A | 7/2020 |
| CN | 111445858 A | 7/2020 |
| CN | 111462694 A | 7/2020 |
| CN | 111627375 A | 9/2020 |
| CN | 111710298 A | 9/2020 |
| CN | 112562593 A | 3/2021 |
| CN | 113066434 A | 7/2021 |
| CN | 113707090 A | 11/2021 |
| CN | 113937157 A | 1/2022 |
| CN | 114038430 A | 2/2022 |

* cited by examiner

DISPLAY PANEL HAVING SCAN LINES AND SCATTER LINES CONNECTED TO SWITCHES, METHOD OF DRIVING A DISPLAY UNIT, AND DISPLAY DEVICE HAVING A DISPLAY UNIT DRIVEN THEREBY

CROSS-REFERENCE TO RELATED APPLICATIONS

This present application claims priority under 35 U.S.C. § 119 to Chinese Patent Application No. 202111652861.4 filed on Dec. 30, 2021, with the Patent Office of the State Intellectual Property Office of the People's Republic of China, entitled "A display panel, a display device and a driving method for display unit", the contents of which is explicitly incorporated herein by reference in its entirety.

FIELD

The present disclosure relates to the field of display technology, in particular to a display panel, a display device and a driving method for display unit.

BACKGROUND

With the development of display technology, liquid crystal displays (LCD) are developing towards organic light-emitting Diode (OLED) technology, compared with LCD, OLED has the advantages of low power consumption, fast response, wide viewing angle and others, since OLED has more advantages compared to LCD, therefore, more and more display manufacturers have invested in OLED research and development, greatly promoting the OLED industrialization process. In the related technologies, while OLED being a display unit in the display panel, driving method for the display unit is complex, how to provide a simple and effective driving method has become an urgent problem to be solved.

SUMMARY

The present disclosure provides a display panel, a display device and a driving method for display unit, to solve the problem that the driving method for display unit the related technology is complex.

In a first aspect, the present disclosure provides a driving method for display unit, applied to a display device, the display device comprises: a first circuit, a second circuit, a third circuit, a fourth circuit, the first circuit is provided with a display unit, a first switch, a second switch, the second circuit is provided with a third switch, a storage capacitor, the third circuit is provided with a fourth switch, the fourth circuit is provided with a fifth switch, a sixth switch, the driving method for display unit comprises: providing a reset signal for turning on the third switch to the display device to form a first reset circuit configured to make a potential of the storage capacitor consistent with the potential of an output voltage of a power supply output end to generate a first turning on signal; turning on the fourth switch and the first switch to form a second reset circuit configured to make the potential of an anode of the display unit consistent with the potential of the output voltage of the power supply output end when the reset signal is further configured to turn on the third switch; providing a charging signal for turning on the fourth switch and the sixth switch to the display device and outputting the first turning on signal from the storage capacitor to turn on the second switch after the reset signal ends;, forming a charging circuit for transmitting a data voltage to the storage capacitor to generate a second turning on signal when the second switch, the fourth switch and the sixth switch are turned on; providing a light emitting signal for turning on the first switch, the fifth switch to the display device and outputting the second turning on signal from the storage capacitor to turn on the second switch after the charging signal ends; forming a light emitting circuit for driving the display unit to emit light when the first switch, the second switch and the fifth switch are turning on.

In some embodiments, controlling the fifth switch and the sixth switch to be in a turn off state when the first switch, the third switch and the fourth switch are turning on by the reset signal; controlling the first switch, the third switch and the fifth switch to be in a turn off state when the fourth switch and the sixth switch are turning on by the charging signal; controlling the third switch, the fourth switch and the sixth switch to be in a turn off state when the first switch and the fifth switch are turning on by the light emitting signal.

In some embodiments, wherein providing the charging signal to the display device after the reset signal ends comprises: outputting the charging signal to the display device after the reset signal ends and after a preset duration; providing the light emitting signal to the display device after the charging signal ends comprises: outputting the light emitting signal to the display device after the charging signal ends and after a preset duration.

In some embodiments, a sum of the duration of the reset signal, a duration of the charging signal, a duration of the light emitting signal and a preset duration are equal to a duration of one frame display signal.

In some embodiments, a duration of the reset signal is consistent with a duration of the charging signal.

In some embodiments, the reset signal comprises: a first driving signal for turning on the third switch, a second driving signal for turning on the fourth switch, a third driving signal for turning on the first switch; the charging signal comprises: a fourth driving signal for turning on the fourth switch, a fifth driving signal for turning on the sixth switch; and the light emitting signal comprises: a sixth driving signal for turning on the first switch, a seventh driving signal, the sixth driving signal for turning on the fifth switch.

In a second aspect, the present disclosure provides a display device, comprising: a first scan line, a second scan line, a third scan line, a first scatter line, a second scatter line; wherein the first scan line is connected with the sixth switch for transmitting the driving signal of the sixth switch to the sixth switch; the second scan line is connected with the fourth switch for transmitting the driving signal of the first switch to the fourth switch; the third scan line is connected with the third switch for transmitting the driving signal of the third switch to the third switch; the first scatter line is connected with the fifth switch for transmitting the driving signal of the fifth switch to the fifth switch; and the second scatter line is connected with the first switch for transmitting the driving signal of the first switch to the first switch.

In some embodiments, the display device further comprises: a first scan output end, a second scan output end and a scatter output end; wherein the first scan output is connected with the first scan line and the second scan line, respectively, for providing a corresponding driving signal for the first scan line and/or the second scan line; the second scan output is connected with the third scan line for providing a corresponding driving signal for the third scan line; and the scatter output is connected with the first scatter line and the second scatter line, respectively, for providing a corresponding driving signal for the first scatter line and/or the second scatter line.

In a third aspect, the present disclosure provides a display panel, comprising a frame and a display device provided with a display unit, the display device is disposed on the frame, and the display unit is driven by the driving method for display unit. The driving method for display unit comprises: providing a reset signal for turning on the third switch to the display device to form a first reset circuit for making the potential of the storage capacitor consistent with the potential of the output voltage of the output end of the power supply to generate a first turning on signal; The reset signal is also configured to turn on the fourth switch and the first switch while turning on the third switch, forming a second reset circuit configured to make the potential of the anode of the display unit and the potential of the output voltage of the output end of the power supply consistent;

After the reset signal ends, a charging signal is provided to the display device, the charging signal is configured to turn on the fourth switch and the sixth switch, and after the reset signal ends, the storage capacitor outputs the first turning on signal to turn on the second switch; When the second switch, the fourth switch and the sixth switch are turning on, a charging circuit is formed, and the charging circuit is configured to transmit the data voltage to the storage capacitor to generate a second turning on signal;

After the charging signal ends, a light emitting signal is provided to the display device, the light emitting signal is configured to turn on the first switch and the fifth switch, and after the charging signal ends, the storage capacitor output the second turning on signal to turn on the second switch; When the first switch, the second switch and the fifth switch are turning on, a light emitting circuit is formed, and the light emitting circuit is configured to drive the display unit to emit light.

In some embodiments, the display unit comprises: a red light display unit, a green light display unit and a blue light display unit; in a preferred embodiment, the display unit comprises a red light display unit, a green light display unit, a blue light display unit and a yellow light display unit.

The above-described technical solution provided in the embodiments of the present disclosure has the following advantages compared with the prior art:

In the method provided in the present embodiment, by providing a reset signal for turning on the third switch to the display device to form a first reset circuit configured to make a potential of the storage capacitor consistent with the potential of an output voltage of a power supply output end to generate a first turning on signal; turning on the fourth switch and the first switch to form a second reset circuit configured to make the potential of an anode of the display unit consistent with the potential of the output voltage of the power supply output end when the reset signal is further configured to turn on the third switch; providing a charging signal for turning on the fourth switch and the sixth switch to the display device and outputting the first turning on signal from the storage capacitor to turn on the second switch after the reset signal ends; forming a charging circuit for transmitting a data voltage to the storage capacitor when the second switch, the fourth switch and the sixth switch are turned on to generate a second turning on signal; providing a light emitting signal for turning on the first switch, the fifth switch to the display device and outputting the second turning on signal from the storage capacitor to turn on the second switch after the charging signal ends; and forming a light emitting circuit for driving the display unit to emit light when the first switch, the second switch and the fifth switch are turned on, the display unit is driven by the method provided by the present disclosure, and the reset circuit is formed by the reset signal; a charging circuit is formed by the charging signal; the light emitting circuit is formed by the light emitting signal, that is, by the various control signals, multiplexing of the circuit in the display device can be achieved, which do not need to design a circuit for each function, the driving of the display unit can be achieved and the complex problem of display unit control in related technologies is solved.

BRIEF DESCRIPTION OF THE DRAWINGS

The drawings herein are incorporated into the description and form part of the present description, illustrating embodiments consistent with the present disclosure, and together with the description for explaining the principles of the present disclosure.

In order to illustrate the embodiments of the present disclosure or the technical solution in the prior art more clearly, the drawings required to be used in the embodiments or prior art descriptions will be briefly described below, it will be apparent that for those of ordinary skilled in the art, without sacrificing creative labor, other drawings may also be obtained according to these drawings.

REFERENCES

1. First circuit; 2. Second circuit; 3. Third circuit; 4. Fourth circuit; 5. Display unit; 61. First reset circuit; 62. Second reset circuit; 7. Charging circuit; 8. Light emitting circuit; T1. First switch; T2. Second switch; T3. Third switch; T4. Fourth switch; T5. Fifth switch; T6. Sixth switch; C. Storage capacitance; Scan(n)1. First scan line; Scan(n)2. Second scan line; Scan(n−1). Third scan line; EM(n)1. First scatter line; EM(n)2. Second scatter line; A1. First MOS tube; A3. Second MOS tube; B1. First inverter; B2. Second inverter; ELVDD. DC power signal (positive); ELVSS. DC power signal (negative); 10. Framework; 11.

Display device; 111. Processor; 112. Communication interface; 113. Memory; 114. Communication bus.

DETAILED DESCRIPTION

In order to make the purpose, technical solution and advantages of the embodiment of the present disclosure clearer, the following will be combined with the accompanying drawings in the embodiment of the present disclosure, the technical solution in the embodiment of the present disclosure is clearly and completely described, obviously, the embodiments described are parts of the embodiment of the present disclosure, not all of the embodiments. Based on the embodiments in the present disclosure, all other embodiments obtained by those of ordinary skilled in the art without performing creative labor, are within the scope of protection of the present disclosure.

An Embodiment

Figure 1:
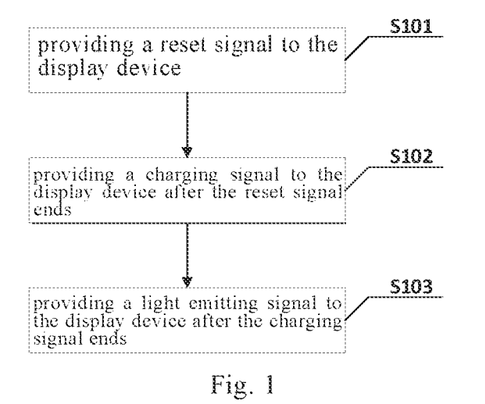
FIG. 1 is a schematic diagram of a driving method for display unit in an embodiment of the present disclosure.
Figure 2:
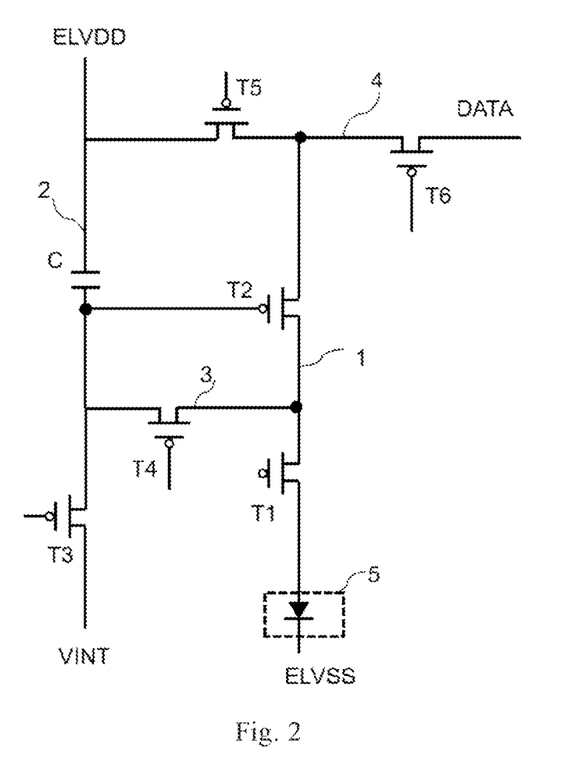
FIG. 2 is a schematic diagram of the basic structure of a display device in an embodiment of the present disclosure.

FIG. 1 is a schematic diagram of a driving method for a display unit 5 in an embodiment of the present disclosure, it should be understood that the driving method for the display unit 5 provided in the present example is applied to a display device, wherein, as shown in FIG. 2, the display device comprises: a first circuit 1, a second circuit 2, a third circuit 3, a fourth circuit 4, the first circuit 1 is provided with a display unit 5, a first switch T1, a second switch T2, the second circuit 2 is provided with a third switch T3, a storage capacitor C, the third circuit 2 is provided with a fourth switch T4, the fourth circuit 4 is provided with a fifth switch T5, a sixth switch T6, as shown in FIG. 1, the driving method for display unit 5 comprises, but not limited to:

S101, providing a reset signal for turning on the third switch T3 to the display device to form a first reset circuit 61 configured to make a potential of the storage capacitor C consistent with the potential of an output voltage of a power supply output end to generate a first turning on signal; turning on the fourth switch T4 and the first switch T1 to form a second reset circuit 62 configured to make the potential of an anode of the display unit 5 consistent with the potential of the output voltage of the power supply output end when the reset signal is further configured to turn on the third switch;

S102, providing a charging signal for turning on the fourth switch T4 and the sixth switch T6 to the display device and outputting the first turning on signal from the storage capacitor to turn on the second switch T2 after the reset signal ends; forming a charging circuit 7 for transmitting a data voltage to the storage capacitor C when the second switch T2, the fourth switch T4 and the sixth switch T6 are turned on to generate a second turning on signal;

S103, providing a light emitting signal for turning on the first switch T1, the fifth switch T5 to the display device and outputting the second turning on signal from the storage capacitor C to turn on the second switch T2 after the charging signal ends; and forming a light emitting circuit 8 for driving the display unit to emit light when the first switch T1, the second switch T2 and the fifth switch T5 are turned on.

Specifically, as shown in FIG. 2, in the above-described display device, the first circuit 1 is successively provided with a display unit 5, a first switch T1, a second switch T2, and one end of the first circuit 1 closing to the second switch T2 is connected with the fourth circuit 4; the second circuit 2 is successively provided with a third switch T3, storage capacitor C, one end of the second circuit 2 closing to the third switch T3 is connected with the power supply output; one end of the third circuit 2 is connected with the second circuit 2 and is connected between the third switch T3 and the storage capacitor C, the other end of the third circuit 2 is connected with the first circuit 1 and is connected between the first switch T1 and the second switch T2; one end of the fourth circuit 4 is connected with the second circuit 2 and is connected at one side of the storage capacitor C away from the third switch T3, the fourth circuit 4 is provided with a fifth switch T5, a sixth switch T6. Further, the fourth switch T4 is provided in intervals with the fifth switch T5, the fifth switch T5 is disposed at one side closing to the second circuit 2.

Following the above example, in some examples, the first switch T1, the second switch T2, the third switch T3, the fourth switch T4, the fifth switch T5, and the sixth switch T6 can be enhanced metal oxide semiconductor field effect transistor, specifically, the first switch T1, the second switch T2, the third switch T3, the fourth switch T4, the fifth switch T5, and the sixth switch T6 can be a PMOS tube or NMOS tube; Preferably, the first switch T1, the second switch T2, the third switch T3, the fourth switch T4, the fifth switch T5, and the sixth switch T6 are all NMOS tubes, it should be understood that when a positive voltage is applied to agate electrode of the MOS FET of N-channel, due to the action of the electric field, the negative electrons of a source electrode and a drain electrode of the N-type semiconductor are attracted out and flock to the gate electrode, however due to the obstruction of the oxide film, electrons are concentrated in the P-type semiconductor between the two N-channels to form a current that break over between the source electrode and the drain electrode. It can be imagined that there is a ditch between two N-type semiconductors, the establishment of the gate electrode voltage is equivalent to building a bridge between them, and the size of the bridge is determined by the size of the gate electrode voltage. Thus, by controlling the intensity of each driving signal, that is, controlling the intensity of the reset signal, charging signal, and light emitting signal, the light emitting brightness of the display unit 5 can be controlled, which will be described in detail in subsequent examples, which will not be described here.

It should be understood that, before providing the reset signal to the display device, the driving method for the display unit 5 further comprises: determining whether a frame display signal is received, when receiving a frame display signal, it is necessary to display according to the display signal, and when the previous frame display signal is completed, a reset signal is provided to the display device.

It should be understood that when the third switch T3, the fourth switch T4 and the first switch T1 are turned on by the reset signal and the first reset circuit 61 and the second reset circuit 62 are formed, the initial voltage output at the output of the power supply will reset the storage capacitor C and the display unit 5, specifically, when forming the first reset circuit 61, the initial voltage output at the output of the power supply will make the potential of the storage capacitor C the same as the potential of the initial voltage, and then when the charging circuit 7 is subsequently formed according to the charging signal, the output voltage turns on the second switch T2. Wherein, when forming the second reset circuit 62, the initial voltage output at the output of the power supply will make the potential of the anode of the display unit 5 the same as the potential of the initial voltage, and then a light emitting circuit 8 is formed according to the light emitting signal, when the display unit 5 is driven, the display unit 5 is in a reset state, that is, when driving the display unit 5 according to each frame display signal, the display unit 5 is in a reset state.

Figure 3:
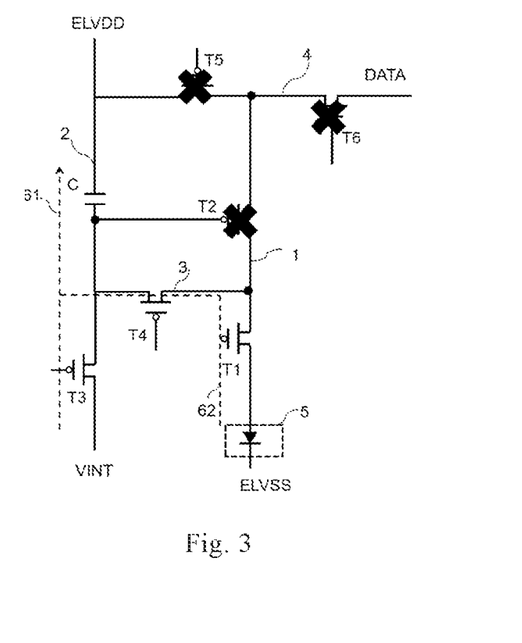
FIG. 3 is a basic schematic diagram of a reset circuit in an embodiment of the present disclosure.

In some examples of the present embodiment, when the reset signal turns on the first switch T1, the third switch T3 and the fourth switch T4, the second switch T2, the fifth switch T5 and the sixth switch T6 are controlled to be in a turn off state, thereby forming a first reset circuit 61 and a second reset circuit 62, as shown in FIG. 3; specifically, when the fifth switch T5 and the sixth switch T6 are MOS tubes, the fifth switch T5 and the sixth switch T6 are controlled to be in a turn off state by a manner comprising but not limited to: stopping outputting of the driving signal of the fifth switch T5 and the sixth switch T6, which turns off the fifth switch T5 and the sixth switch T6, and it should be understood that since no control signal is output at this time to turn on the second switch T2, the second switch T2 stays in a turn off state. In some examples, the second switch T2, the fifth switch T5 and the sixth switch T6 are controlled to be in the turn off state by a manner that may be: respectively output a turn off signal to the fifth switch T5 and the sixth switch T6, so that the fifth switch T5 and the sixth switch T6 are in the turn off state.

Figure 4:
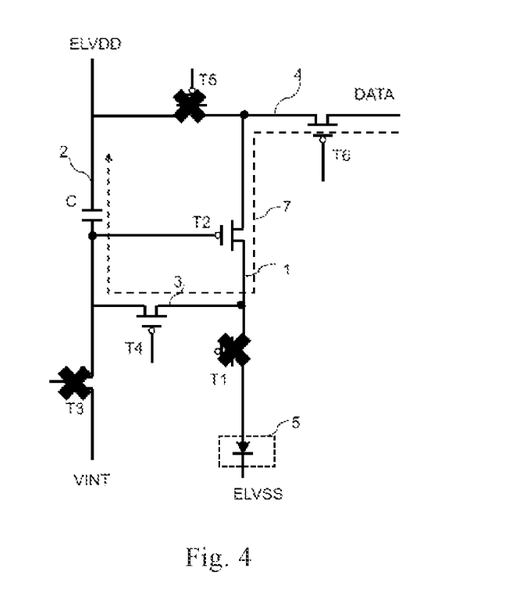
FIG. 4 is a basic schematic diagram of a charging circuit in an embodiment of the present disclosure.

In some examples of the present embodiment, when the charging signal turns on the fourth switch T4 and the sixth switch T6, the first switch T1, the third switch T3 and the fifth switch T5 are controlled to be in a turn off state, thereby forming a charging circuit 7, transmitting the data voltage to the storage capacitance C for charging, as shown in FIG. 4; it is understood that when the third switch T3 turns off, the path between the output of the power supply and the storage capacitor C is disconnected, so that the storage capacitor C is in a discharged state, and the storage capacitor C transmits the initial voltage as the first turning on signal to the second switch T2 to control the second switch T2 to turn on, wherein the potential of the initial voltage can determine the degree of turning on of the second switch T2, thereby control the subsequent charging effect and realize the controlling of the light emitting brightness of the display unit 5; specifically, when the first switch T1, the third switch T3 and the fifth switch T5 are MOS tubes, the first switch T1, the third switch T3 and the fifth switch T5 are controlled to be in the turn off state by a manner comprising but not limited to: stopping outputting of the driving signal of the first switch T1, the third switch T3 and the fifth switch T5, so that the first switch T1, the third switch T3 and the fifth switch T5 are turned off. In some examples, the first switch T1, the third switch T3 and the fifth switch T5 are controlled to be in the turn off state by a manner that may also be: respectively outputting a turn off signal to the first switch T1, the third switch T3 and the fifth switch T5, so that the first switch T1, the third switch T3 and the fifth switch T5 are in the turn off state.

Figure 5:
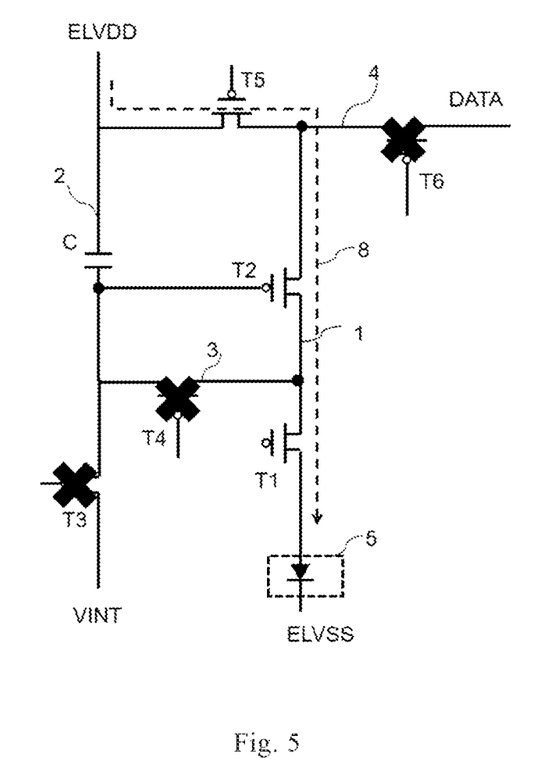
FIG. 5 is a basic schematic diagram of a light emitting circuit in an embodiment of the present disclosure.

In some examples of the present embodiment, when the light emitting signal turns on the first switch T1 and the fifth switch T5, the third switch T3, the fourth switch T4 and the sixth switch T6 are controlled to be in a turn off state, thereby forming a light emitting circuit 8, as shown in FIG. 5. It is understood that when the fourth switch T4 turns off, the path between the fourth circuit 4 and the storage capacitor C is disconnected, therefore, the storage capacitor C is in a discharged state, and the storage capacitor C transmits the data voltage as a second turning on signal to the second switch T2, controlling the second switch T2 to turn on, wherein the potential of the data voltage can determine the degree of turning on of the second switch T2, thereby control the current flowing through the charging circuit 7 to achieve the controlling of the brightness of the display unit 5. Specifically, when the third switch T3, the fourth switch T4 and the sixth switch T6 are MOS tubes, the third switch T3, the fourth switch T4 and the sixth switch T6 are controlled to be in the turn off state by a manner comprising but not limited to: stopping the outputting of the driving signal of the third switch T3, the fourth switch T4 and the sixth switch T6, so that the third switch T3, the fourth switch T4 and the sixth switch T6 are turned off. In some examples, the third switch T3, the fourth switch T4 and the sixth switch T6 are controlled to be in the turn off state by a manner that may also be: respectively outputting a turn off signal to the third switch T3, the fourth switch T4 and the sixth switch T6, so that the third switch T3, the fourth switch T4 and the sixth switch T6 are in the turn off state.

Figure 6:
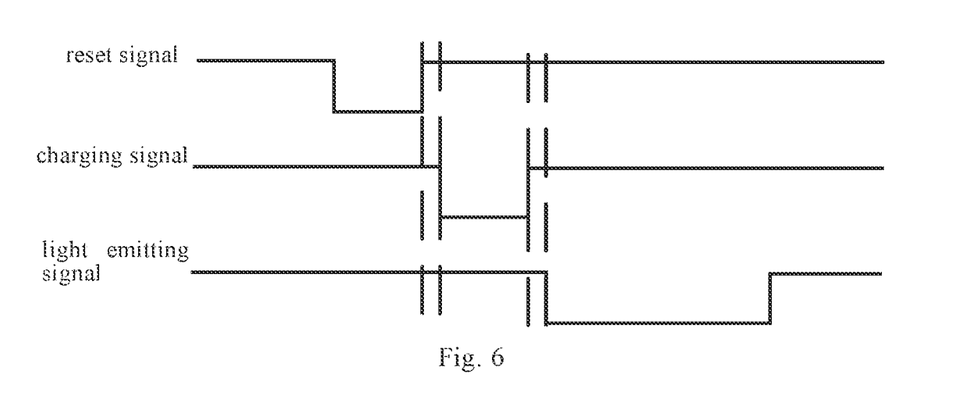
FIG. 6 is an optional signal timing schematic diagram in an embodiment of the present disclosure.
Figure 7:
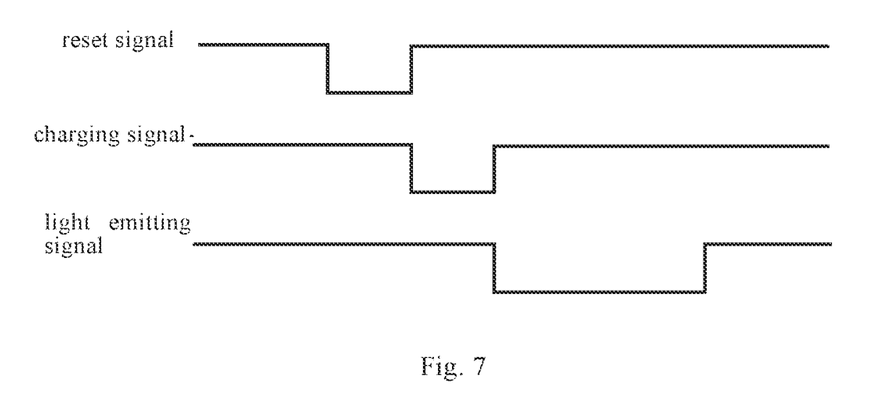
FIG. 7 is a schematic diagram of another optional signal timing in an embodiment of the present disclosure.

In some examples of the present embodiment, after the reset signal ends, the charging signal is provided to the display device, wherein: after the reset signal ends and after a preset duration, the charging signal is output to the display device; after the charging signal ends, the light emitting signal is provided to the display device, wherein: after the charging signal ends and after a preset duration, the light emitting signal is output to the display device. As shown in FIG. 6, the preset duration may be flexibly set by the relevant personnel, which will not be limited by the present embodiment, preferably, the preset duration is lower than the duration of the charging signal; it should be understood that, in some examples, the preset duration may be 0, at this time, after the reset signal ends, the charging signal is directly output, and after the charging signal ends, the light emitting signal is directly output, as shown in FIG. 7.

In some examples of the present embodiment, the sum of the duration of the reset signal, the duration of the charging signal, the duration of the light emitting signal and the preset duration are equal to the duration of one frame display signal. It should be understood that the reset signal, charging signal and light emitting signal are contained within a frame display signal, therefore, the sum of the duration of the reset signal, charging signal, the light emitting signal and the preset duration is equal to the duration of a frame display signal.

In some examples of the present embodiment, the duration of the reset signal is consistent with the duration of the charging signal; in some examples, the preset duration is lower than the duration of the charging signal, i.e., the preset duration is also lower than the duration of the reset signal; in some examples, the duration of the reset signal and the duration of the charging signal are both lower than the duration of the light emitting signal. Meanwhile, it is understood that if the relevant personnel aims to achieve a special display effect, the duration of the reset signal and the duration of the charging signal can be inconsistent, or the duration of the light emitting signal is lower than the duration of the reset signal and/or the duration of the charging signal.

In some examples of the present embodiment, the reset signal comprises: a first driving signal for turning on the third switch T3, a second driving signal for turning on the fourth switch T4, a third driving signal for turning on the first switch T1; it should be understood that, the duration of the first driving signal, the second driving signal, and the third driving signal are consistent;

The charging signal comprises: a fourth driving signal for turning on the fourth switch T4, a fifth driving signal for turning on the sixth switch T6, it should be understood that the duration of the fourth driving signal, the fifth driving signal are consistent;

The light emitting signal comprises: a sixth driving signal for turning on the first switch T1, a seventh driving signal for turning on the fifth switch T5, it should be understood that the duration of the sixth driving signal, the seventh driving signal are consistent.

In the driving method for display unit 5 provided in the present embodiment, by providing a reset signal to the display device, the reset signal is used to turn on the third switch T3, forming a first reset circuit 61, the first reset circuit 61 is used to make the potential of the storage capacitor C consistent with the potential of the output voltage of the output of the power supply to generate a first turning on signal; the reset signal is further used to turn on the fourth switch T4 and the first switch T1 while turning on the third switch T3, forming a second reset circuit 62, the second reset circuit 62 is used to make the potential of the anode of the display unit 5 consistent with the potential of the output voltage of the output of the power supply; after the reset signal ends, a charging signal is provided to the display device, the charging signal is used to turn on the fourth switch T4 and the sixth switch T6, after the reset signal ends, the storage capacitor C outputs the first turning on signal to turn on the second switch T2; when the second switch T2, the fourth switch T4 and the sixth switch T6 are turned on, a charging circuit 7 is formed, the charging circuit 7 is used to transmit the data voltage to the storage capacitor C, to generate a second turning on signal; after the charging signal ends, a light emitting signal is provided to the display device, the light emitting signal is used to turn on the first switch T1, the fifth switch T5, after the charging signal ends, the storage capacitor C outputs the second turning on signal to turn on the second switch T2; when the first switch T1, the second switch T2 and the fifth switch T5 are turned on, a light emitting circuit 8 is formed, the light emitting circuit 8 is used to drive the display unit 5 to emit light. By the above method, the display unit 5 is drive, a reset circuit is formed by the reset signal, a charging circuit 7 is formed by the charging signal, a light emitting circuit 8 is formed by the light emitting signal, that is, by various control signals, multiplexing in the circuit in the display device can be achieved, thereby not need to design a circuit for each function, achieving driving of the display unit 5, to solve the problem of the controlling of the display unit 5 being complex in relevant technology.

Another Embodiment

Figure 8:
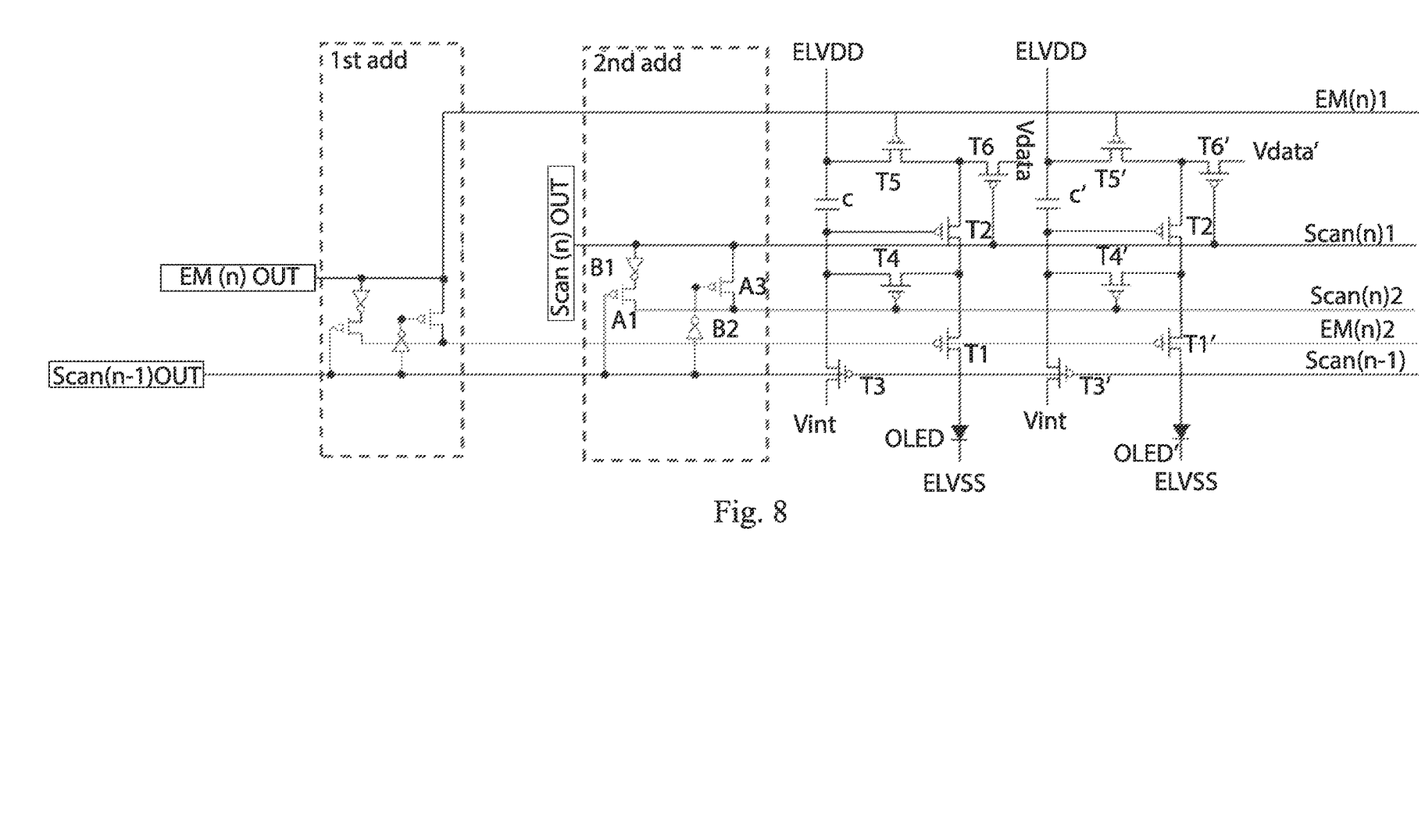
FIG. 8 is a schematic diagram of the basic structure of a display device in another embodiment of the present disclosure.

Based on the same concept, the present embodiment provides a display device, as shown in FIG. 8, the display device comprises, but is not limited to: a first scan line Scan(n)1, a second scan line Scan(n)2, a third scan line Scan(n–1), a first scatter line EM(n)1, a second scatter line EM(n)2; the first scan line Scan(n)1 is connected with the sixth switch T6 for transmitting the driving signal for the sixth switch T6 to the sixth switch T6; the second scan line Scan(n)2 is connected with the fourth switch T4 for transmitting the driving signal for the first switch T1 to the fourth switch T4; the second scan line Scan(n–1) is connected with the third switch T3 for transmitting the driving signal for the third switch T3 to the third switch T3; the first scatter line EM(n)1 is connected with the fifth switch T5 for transmitting the driving signal for the fifth switch T5 to the fifth switch T5; the second scatter line EM(n)2 is connected with the first switch T1 for transmitting the driving signal for the first switch T1 to the first switch T1.

The display device further comprises: a first scan output end Scan(n) out, a second scan output end Scan(n–1) out and a scatter output end EM(n) out; wherein, the first scan output end is connected with the first scan line Scan(n)1 and the second scan line Scan(n)2, respectively, for providing corresponding driving signal to the first scan line Scan(n)1 and/or the second scan line Scan(n)2; the second scan output end is connected with the second scan line Scan(n–1) for providing corresponding driving signal for the second scan line Scan(n–1); the scatter output end is connected with the first scatter line EM(n)1 and the second scatter line EM(n)2, respectively, for providing corresponding driving signal to the first scatter line EM(n)1 and/or the second scatter line EM(n)2;

It should be understood that, as shown in FIG. 8, the display device is provided with MOS tubes: a first MOS tube AI and a second MOS tube A3, the same as the rest of the switches, e.g., the above MOS tube A1/A3 and the above switch T1-T6 are made of low Temperature Poly-silicon (LTPS) or indium gallium zinc oxide (IGZO); It will be understood that the present embodiment does not limit the production method of each switch or MOS tube A1/A3, those skilled in the art can flexibly choose the production method.

Figure 9:
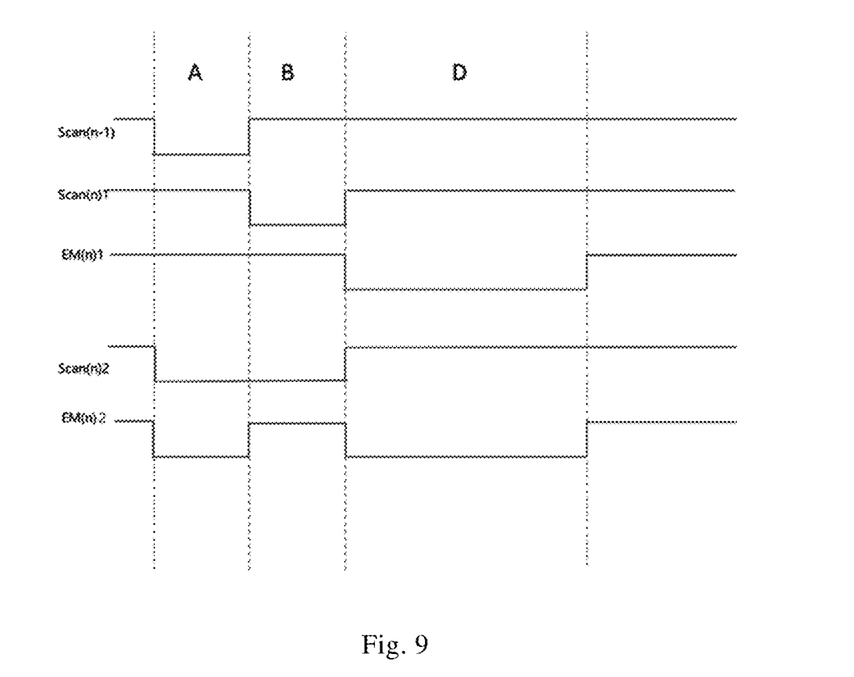
FIG. 9 is an optional signal timing diagram in another embodiment of the present disclosure.
Figure 10:
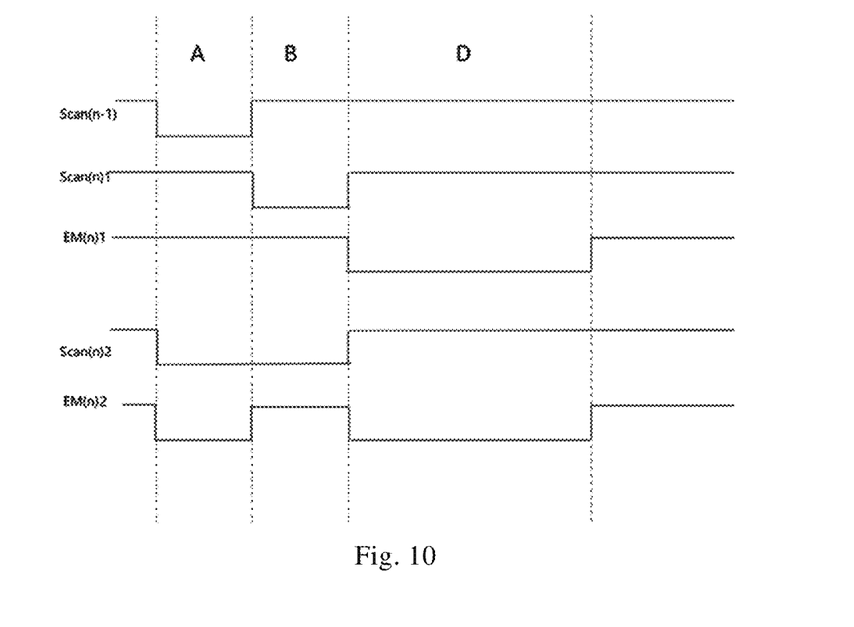
FIG. 10 is a schematic diagram of another optional signal timing in another embodiment of the present disclosure.

It should be understood that, as shown in FIG. 8, inverters are added: a first inverter B1 and a second inverter B2; to correspond to a waveform schematic view of Scan(n)1/2, Scan(n–1), EM(n)1/2 when there is no interval between Scan(n) and Scan(n–1), as shown in FIG. 10, i.e., in the driving method for display unit 5 in the above embodiment, the reset signal comprises a first driving signal, a second driving signal, a third driving signal, the charging signal comprises: a fourth driving signal, a fifth driving signal, the light emitting signal comprises: a sixth driving signal, a seventh driving signal; wherein the first driving signal is sent by the second scan output end, and transmitted to the third switch T3 through the second scan line Scan(n–1), to turn on or turn off the third switch T3, the second driving signal is sent by the first scan output end, and transmitted to the fourth switch T4 through the second scan line Scan(n)2 to turn on or turn off the fourth switch T4; the third driving signal is sent by the scatter output end, and transmitted to the first switch T1 through the second scatter line EM(n)2, to turn on or turn off the first switch T1; the fourth driving signal is sent by the first scan output, and transmitted to the fourth switch T4 through the second scan line Scan(n)2, to turn on or turn off the fourth switch T4; the fifth driving signal is sent by the first scan output and transmitted to the sixth switch T6 through the first scan line Scan(n)1 to turn on or turn off the sixth switch T6; the sixth driving signal is sent by the scatter output, and transmitted to the first switch T1 through the second scatter line EM(n)2, to turn on or turn off the first switch T1; the seventh driving signal is sent by the scatter output end, and transmitted to the fifth switch T5 through the first emitter line EM(n)1, to turn on or turn off the fifth switch T5, wherein the timing of the transmitted driving signal of the first scan line Scan(n)1, second scan line Scan(n)2, second scan line Scan(n–1), first scatter line EM(n)1, second scatter line EM(n)2 are as shown in FIG. 9.

It is understood that when the reset signal is output to the display device, when the signal output by the second scan line Scan(n–1) is low, T3/T3'/A1 is turned on, the signal output by the first scan output Scan(n) was originally high and become low after reversing through the first inverter B1, the signal transmitted by the second scan line Scan(n)2 is low, then the switches T4/T4' turn on; the low signal output by the second scan line Scan(n–1) become high after reversing via the second inverter B2, the switch tube A3 turns off, the signal transmitted by the first scan line Scan(n)1≠the signal transmitted by the second scan line Scan(n)2, the signal transmitted by the first scan line Scan(n)1 remains high, the sixth switch T6/T6' controlled by it turns off; thus the first switch T1/T1' is turned on, and the fifth switch T5/T5' is turned off; while the output voltage Vint of the output of the power supply initialize the storage capacitor C via the first reset circuit 61 formed by the third switch T3, and initialize the display unit 5 via the second reset circuit 62 formed by switches T3/T4/T1.

It will be understood that, after the reset signal ends, when providing the charging signal to the display device and when the signal transmitted by the second scan line Scan(n−1) is high, the third switch T3/T3' and the first MOS tube A1 is turned off, via the second inverter B2, the second MOS tube A3 has a low gate, the second MOS tube A3 is turned on, and the output signal of the first scan output Scan(n) OUT is Low; while the signal transmitted by the first scan line Scan(n)1=the signal transmitted by the second scan line Scan(n)2; with switch T4/T4' turning on, switch T6/T6' turning on, switch T3/T1/T5 turning off, a charging circuit 7 is formed, thereby charging the storage capacitor C via the data voltage Vdata;

It will be understood that, after the charging signal ends, when providing a light emitting signal to the display device, the first scan line Scan(n), the second scan line Scan(n−1) output high signal, the switch T3/T3' and the first MOS tube A1 are all turned off, the second MOS tube A3 is turned on, however, since the signal output by the first scan output Scan(n) OUT was originally high, the signal transmitted by the first scan line Scan(n)1=the signal transmitted by the second scan line Scan(n)2 and are both high, the switch T4/T6,T4'/T6' controlled by it are all turned off; however, at this time, the signal output by the scatter output EMn (OUT) is low, the signal transmitted by the first scatter line EM(n) 1=the signal transmitted by the second scatter line EM(n)2 and are both low, the switches T5/T5', T1/T1' controlled by it are turned on, a current provided by the DC power signal (positive) ELVDD flows to the DC power signal (negative) ELVSS, specifically, the current provided by the DC power signal (positive) ELVDD passes through the switch T5/T5', then through the switch T2 for controlling output, through the switch T1/T1' and then through the display unit 5 (OLED/OLED') and flows to the DC power signal (negative) ELVSS, which in turn drives the display unit 5 (OLED/OLED') to emit light.

It should be understood that, as shown in FIG. 10, FIG. 10 shows the waveform diagrams of Scan(n)1/2, Scan(n−1), EM(n)1/2 corresponding to the situation where there are intervals between Scan(n) and Scan(n−1), Scan(n) and EM(n), it should be understood that all the switches (T1 to 6) in zone E/C are turned off.

Another Embodiment

Figure 11:
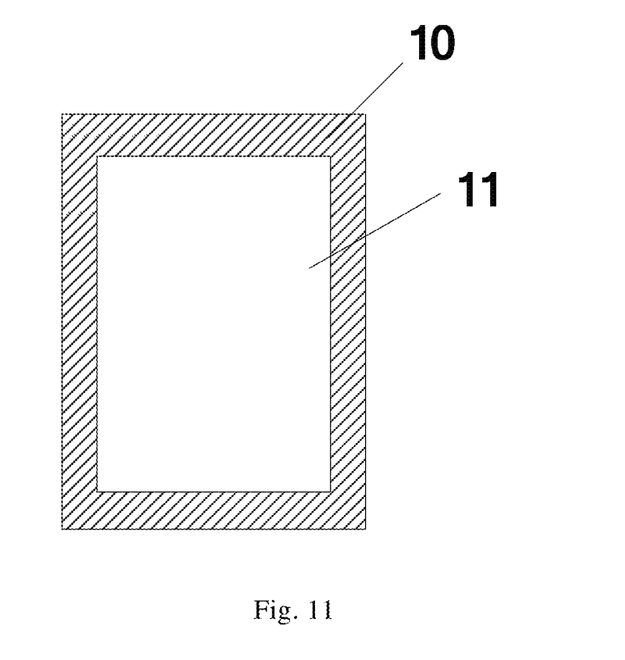
FIG. 11 is a schematic diagram of the basic structure of a display panel in another embodiment of the present disclosure.

Based on the same concept, the present embodiment provides a display panel, as shown in FIG. 11, the display panel comprises a frame 10 and a display device 11 provided with a display unit, the display device 11 is disposed on the frame 10, further, the display unit is driven by the driving method for display unit. The driving method for display unit comprises: providing a reset signal for turning on the third switch to the display device to form a first reset circuit for making the potential of the storage capacitor consistent with the potential of the output voltage of the output end of the power supply to generate a first turning on signal; The reset signal is also configured to turn on the fourth switch and the first switch while turning on the third switch, forming a second reset circuit configured to make the potential of the anode of the display unit and the potential of the output voltage of the output end of the power supply consistent; After the reset signal ends, a charging signal is provided to the display device, the charging signal is configured to turn on the fourth switch and the sixth switch, and after the reset signal ends, the storage capacitor outputs the first turning on signal to turn on the second switch; When the second switch, the fourth switch and the sixth switch are turning on, a charging circuit is formed, and the charging circuit is configured to transmit the data voltage to the storage capacitor to generate a second turning on signal; After the charging signal ends, a light emitting signal is provided to the display device, the light emitting signal is configured to turn on the first switch and the fifth switch, and after the charging signal ends, the storage capacitor output the second turning on signal to turn on the second switch; When the first switch, the second switch and the fifth switch are turning on, a light emitting circuit is formed, and the light emitting circuit is configured to drive the display unit to emit light.

It should be understood that the display unit comprises: a red light display unit, a green light display unit and a blue light display unit; alternatively, the display unit comprises a red light display unit, a green light display unit, a blue light display unit and a yellow light display unit.

Another Embodiment

Figure 12:
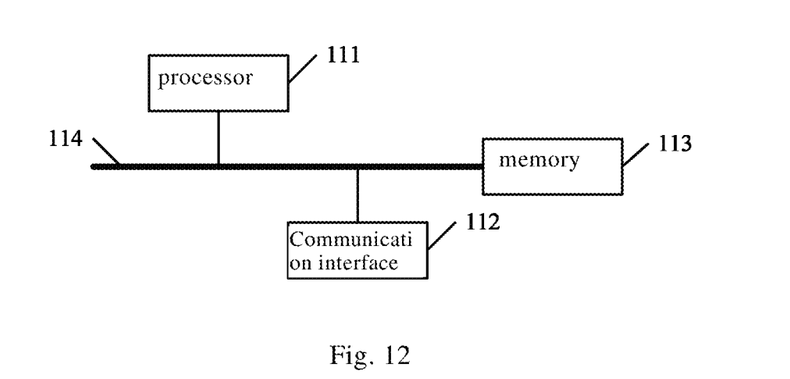
FIG. 12 is a schematic structural diagram of an electronic device in another embodiment of the present disclosure.

As shown in FIG. 12, an embodiment of the present disclosure provides an electronic device, comprising a processor 111, a communication interface 112, a memory 113 and a communication bus 114, wherein the processor 111, the communication interface 112, the memory 113 communicates with each other through the communication bus 114, and the memory 113 is used for storing computer programs.

In an embodiment of the present disclosure, when using for executing the program stored on the memory 113, the processor 111 can implement the steps of the driving method for the display unit. The driving method for display unit comprises: providing a reset signal for turning on the third switch to the display device to form a first reset circuit for making the potential of the storage capacitor consistent with the potential of the output voltage of the output end of the power supply to generate a first turning on signal; The reset signal is also configured to turn on the fourth switch and the first switch while turning on the third switch, forming a second reset circuit configured to make the potential of the anode of the display unit and the potential of the output voltage of the output end of the power supply consistent;

After the reset signal ends, a charging signal is provided to the display device, the charging signal is configured to turn on the fourth switch and the sixth switch, and after the reset signal ends, the storage capacitor outputs the first turning on signal to turn on the second switch; When the second switch, the fourth switch and the sixth switch are turning on, a charging circuit is formed, and the charging circuit is configured to transmit the data voltage to the storage capacitor to generate a second turning on signal;

After the charging signal ends, a light emitting signal is provided to the display device, the light emitting signal is configured to turn on the first switch and the fifth switch, and after the charging signal ends, the storage capacitor output the second turning on signal to turn on the second switch; When the first switch, the second switch and the fifth switch are turning on, a light emitting circuit is formed, and the light emitting circuit is configured to drive the display unit to emit light.

An embodiment of the present disclosure also provides a computer-readable storage medium, on which a computer program is stored, the computer program is executed by the processor to implement the steps of the driving method for the display unit. The driving method for display unit comprises: providing a reset signal for turning on the third switch to the display device to form a first reset circuit for making the potential of the storage capacitor consistent with the potential of the output voltage of the output end of the power supply to generate a first turning on signal; The reset signal is also configured to turn on the fourth switch and the first switch while turning on the third switch, forming a second reset circuit configured to make the potential of the anode of the display unit and the potential of the output voltage of the output end of the power supply consistent;

After the reset signal ends, a charging signal is provided to the display device, the charging signal is configured to turn on the fourth switch and the sixth switch, and after the reset signal ends, the storage capacitor outputs the first turning on signal to turn on the second switch; When the second switch, the fourth switch and the sixth switch are turning on, a charging circuit is formed, and the charging circuit is configured to transmit the data voltage to the storage capacitor to generate a second turning on signal;

After the charging signal ends, a light emitting signal is provided to the display device, the light emitting signal is configured to turn on the first switch and the fifth switch, and after the charging signal ends, the storage capacitor output the second turning on signal to turn on the second switch; When the first switch, the second switch and the fifth switch are turning on, a light emitting circuit is formed, and the light emitting circuit is configured to drive the display unit to emit light.

It should be noted that, herein, relationship terms such as "first" and "second" and the like are used only to distinguish one entity or operation from another entity or operation, and do not necessarily require or imply that there is any such actual relationship or order between these entities or operations. Further, the term "comprise", "comprising" or any other variation thereof is intended to cover non-exclusive inclusion, so that a process, method, article or device comprising a series of elements comprises not only those elements, but also other elements not expressly listed, or also elements inherent in such processes, methods, articles or equipment. In the absence of further restrictions, the elements defined by the statement "comprising a . . . ", do not preclude the existence of additional identical elements in the process, method, article or apparatus that comprises the elements.

The above are only specific embodiments of the present disclosure, enabling those skilled in the art to understand or implement the present disclosure. Various modifications to these embodiments will be apparent to those skilled in the art, the general principles defined herein may be implemented in other embodiments without departing from the spirit or scope of the present disclosure. Accordingly, the present disclosure will not be limited to these embodiments shown herein, but to conform to the widest range consistent with the principles and novel features applied herein.

What is claimed is:

1. A driving method for a display unit of a display device, the display device comprising a first circuit, a second circuit, a third circuit, and a fourth circuit, wherein the first circuit is provided with the display unit, a first switch and a second switch, wherein the second circuit is provided with a third switch and a storage capacitance, wherein the third circuit is provided with a fourth switch, and wherein the fourth circuit is provided with a fifth switch and a sixth switch, the driving method comprising:

providing a reset signal configured for a) turning on the third switch to the display device to form a first reset circuit configured to make a potential of a storage capacitor consistent with a[ potential of an output voltage of a power supply output end to generate a first turning on signal, and b) turning on the fourth switch and the first switch while turning on the third switch to form a second reset circuit configured to make a potential of an anode of the display unit and the potential of the output voltage of the output end of the power supply consistent;

after the reset signal ends, providing, to the display device, a charging signal configured to turn on the fourth switch and the sixth switch after the reset signal ends, outputting, by the storage capacitor, the first turning on signal to turn on the second switch;

when the second switch, the fourth switch and the sixth switch are turning on, forming a charging circuit configured to transmit a data voltage to the storage capacitor to generate a second turning on signal;

after the charging signal ends, providing, to the display device, a light emitting signal configured to turn on the first switch and the fifth switch;

after the charging signal ends, outputting, from the storage capacitor, the second turning on signal to turn on the second switch; and when the first switch, the second switch and the fifth switch are turning on, forming a light emitting circuit configured to drive the display unit to emit light.

2. The driving method of claim 1, further comprising:

controlling the fifth switch and the sixth switch to be in a turn off state when the reset signal is turning on the first switch, the third switch and the fourth switch;

controlling the first switch, the third switch and the fifth switch to be in a turn off state when the charging signal is turning on the fourth switch and the sixth switch; and controlling the fourth switch and the sixth switch to be in a turn off state when the light emitting signal turning on the first switch and the fifth switch, the third switch.

3. The driving method of claim 1, wherein providing the charging signal to the display device after the reset signal ends comprises:

outputting the charging signal to the display device after the reset signal ends and after a preset duration.

4. The driving method of claim 1, wherein providing the charging signal to the display device after the reset signal ends comprises:

outputting the light emitting signal to the display device after the charging signal ends and after a preset duration.

5. The driving method of claim 3, wherein a sum of a duration of the reset signal, a duration of the charging signal, a duration of the light emitting signal and the preset durations are equal to a duration of one frame display signal.

6. The driving method of claim 1, wherein a duration of the reset signal is consistent with a duration of the charging signal.

7. The driving method of claim 1, wherein the reset signal comprises: a first driving signal for turning on the third switch, a second driving signal for turning on the fourth switch, and a third driving signal for turning on the first switch.

8. The driving method of claim 1, wherein the charging signal comprises: a fourth driving signal for turning on the fourth switch and a fifth driving signal for turning on the sixth switch.

9. The driving method of claim 1, wherein the light emitting signal comprises: a sixth driving signal for turning on the first switch and a seventh driving signal for turning on the fifth switch.

10. The driving method of claim 1, wherein each of the first switch, the second switch, the third switch, the fourth switch, the fifth switch, and the sixth switch is an enhanced metal oxide semiconductor field effect transistor.

11. A display panel comprising a frame and a display device provided with a display unit, wherein the display device is disposed on the frame, and wherein the display panel is configured to drive the display unit by:

providing a reset signal configured for a) turning on a third switch to the display device to form a first reset circuit configured to make a potential of a storage capacitor consistent with a potential of an output voltage of a power supply output end to generate a first turning on signal, and b) turning on a fourth switch and a first switch while turning on the third switch to form a second reset circuit configured to make a potential of an anode of the display unit and the potential of the output voltage of the output end of the power supply consistent;

after the reset signal ends, providing, to the display device, a charging signal configured to turn on the fourth switch and a sixth switch after the reset signal ends, outputting, by the storage capacitor,-the first turning on signal to turn on a second switch;

when the second switch, the fourth switch and the sixth switch are turning on, forming a charging circuit configured to transmit a[ data voltage to the storage capacitor to generate a second turning on signal;

after the charging signal ends, providing, to the display device, a light emitting signal configured to turn on the first switch and a fifth switch;

after the charging signal ends, outputting, from the storage capacitor, the second turning on signal to turn on the second switch; and when the first switch, the second switch and the fifth switch are turning on, forming a light emitting circuit configured to drive the display unit to emit light.

12. The display panel of claim 11, wherein the display unit comprises: a red light display unit, a green light display unit and a blue light display unit; or, the display unit comprises a red light display unit, a green light display unit, a blue light display unit and a yellow light display unit.

* * * * *